United States Patent
Geffen et al.

(10) Patent No.: US 6,192,289 B1
(45) Date of Patent: Feb. 20, 2001

(54) METHOD AND APPARATUS FOR ANALYZING CUTS

(75) Inventors: Michael Geffen, Gilon; Abraham Ben-Har, Herzliya, both of (IL)

(73) Assignee: Inspectech Ltd., Carmiel (IL)

( * ) Notice: Under 35 U.S.C. 154(b), the term of this patent shall be extended for 0 days.

(21) Appl. No.: 09/023,558

(22) Filed: Feb. 13, 1998

(30) Foreign Application Priority Data

Apr. 13, 1997 (IL) .................................................... 120656

(51) Int. Cl.[7] .................................................. G06F 19/00
(52) U.S. Cl. .......................... 700/121; 700/195; 700/187; 702/179
(58) Field of Search ..................... 700/121, 167, 700/173–177, 195, 163; 702/179, 182, 185, 81; 382/141, 129; 438/460, 462

(56) References Cited

U.S. PATENT DOCUMENTS

| 5,314,844 | * | 5/1994 | Imamura | 437/22 |
| 5,786,266 | * | 7/1998 | Boruta | 438/462 |
| 5,814,532 | * | 9/1998 | Ichihara | 438/33 |
| 5,871,391 | * | 2/1999 | Pryor | 451/9 |

* cited by examiner

Primary Examiner—William Grant
Assistant Examiner—Kidest Bahta
(74) Attorney, Agent, or Firm—Needle & Rosenberg, P.C.

(57) ABSTRACT

A system for analyzing the quality of the sawing of a material which includes a scanning unit, a cut parameter identifier and a cut analyzer. The scanning unit scans along cuts of the material and views at least a portion of a cut. The cut parameter identifier identifies and stores parameters of the viewed cut portion. The cut analyzer analyzes the parameters of a multiplicity of viewed cut portions and which determines the quality of the cuts therefrom.

7 Claims, 11 Drawing Sheets

BEST LINE

METHOD AND APPARATUS FOR ANALYZING CUTS

FIELD OF THE INVENTION

The present relates to methods and apparatus for inspecting cuts generally and for inspecting cuts of semi-conductor dies in particular.

BACKGROUND OF THE INVENTION

A semiconductor wafer, shown in FIG. 1 to which reference is made, is formed of a multiplicity of dies 10 each of which is to become an integrated circuit chip. Once manufacturing of the wafer and the circuits thereon is finished, a saw rotates a thin dicing blade, containing miniature diamonds, along the vertical and horizontal "streets" 12 between the dies 10, thereby separating each die 10 from its neighbors. The individual dies are then encapsulated.

The saw has to be properly aligned to ensure that the cut occurs only within the relevant street 12; otherwise, the integrated circuit die 10 will be ruined. The blowup portion of FIG. 1 illustrates two dies 10A and 10B and the cut 14 therebetween. Cut 14 has two edges 16A and 16B, known as "kerfs", which typically are similar to each other. Each kerf 16 is formed of "sawing chips" 18 which are indentations caused by the breaking of the wafer in response to the chipping action of the saw blade. As long as the kerfs 16 are sufficiently far away from the relevant die 10, the cut is acceptable. However, if a crack or "sawing chip" 18, such as sawing chip 18A, is too close to the outer edge of the die 10, the corresponding die (e.g. die 10B) is disqualified.

There are additional complications. Due to the continual need to save "real estate" on the semiconductor wafer, the width of the streets 12 is continually narrowing, reducing the available margin of error. Furthermore, the streets 12 are often utilized for test pads and trial lithography which are sacrificed during the dicing. The portions of the lithographic elements remaining after dicing look similar enough to sawing chips that a die could be incorrectly disqualified.

FIG. 2 illustrates an exemplary cut having sawing chips and lithography lines. The elements marked with reference numeral 20 are lithography lines and those marked with reference numeral 22 are sawing chips. It will be appreciated that lithography lines 20 are not very different than sawing chips 22, especially if the lithography lines 20 are even shorter than those shown in FIG. 2. The sawing chip marked by 22A is too close to the die, labeled 10C.

Inspection is performed in a number of ways. Dicing saws typically are equipped with vision capabilities designed for machine set-up (e.g. for aligning the saw blade along the streets 12). Since the dicing operation is performed under a stream of water, the kerf can only be viewed once the water stream is stopped and the wafer dried. For proper inspection, the wafer must be brought to a microscope and the microscope directed to the kerf areas. This process adds time and, since the sawing vision system cannot differentiate between lithographic lines and sawing chips, this operation is only marginally effective.

SUMMARY OF THE INVENTION

It is an object of the present invention to provide a method and apparatus for analyzing the quality of sawing which does not require human inspection. The system of the present invention can be implemented as part of the manufacturing processes of semiconductor wafers, optical elements or any other type of hard material which is cut (such as by micromachining).

For semiconductor wafers, the system of the present invention differentiates between lithographic lines and sawing chips thereby to determine if any part of a kerf is too close to a die. It also determines whether or not the saw blade is properly aligned within the street to reduce the number of disqualified dies.

There is therefore provided, in accordance with a preferred embodiment of the present invention, a system for analyzing the quality of the sawing of a material which includes a scanning unit, a cut parameter identifier and a cut analyzer. The scanning unit scans along cuts of the material and views at least a portion of a cut. The cut parameter identifier identifies and stores parameters of the viewed cut portion. The cut analyzer analyzes the parameters of a multiplicity of viewed cut portions and which determines the quality of the cuts therefrom.

Additionally, in accordance with a preferred embodiment of the present invention, the cut parameter identifier includes a kerf identifier and a chip parameter identifier. The kerf identifier identifies upper and lower kerfs of the viewed cut portion. The chip parameter identifier identifies sawing chips along the upper and lower kerfs and determines parameters thereof.

Moreover, in accordance with a preferred embodiment of the present invention, the chip parameters include at least one of the following parameters: chip height, chip width, chip aspect ratio, chip penetration, chip roughness and chip slope.

Further, in accordance with a preferred embodiment of the present invention, the chip parameter identifier includes a unit which identifies possible sawing chips, a unit which determines the chip parameters for the possible sawing chips and a unit which marks the possible sawing chips as sawing chips or as non-chip elements based on the values of the chip parameters.

Still further, in accordance with a preferred embodiment of the present invention, the cut analyzer includes a cut parameter identifier which compares a center line of the viewed cut portion, defined by center lines of the upper and lower kerfs, to a center line of a street within which the cut occurred to produce at least one of the following cut parameters: cut angle and cut offset. The cut analyzer includes a unit which performs statistical analysis on the cuts of one or more wafers.

Moreover, in accordance with a preferred embodiment of the present invention, the material to be cut is a semiconductor or a hard material.

There is also provided, in accordance with a preferred embodiment of the present invention, a method of identifying sawing chips which includes the steps of: a) identifying upper and lower kerfs of a viewed cut section, b) identifying possible sawing chips along the upper and lower kerfs, c) determining chip parameters for each of the possible sawing chips and d) marking the possible sawing chips as sawing chips or as non-chips based on the values of the chip parameters.

Finally, in accordance with a preferred embodiment of the present invention, the step of marking includes the steps of a) associating a plurality of chip and non-chip membership values with the possible sawing chips based on the values of the chip parameters, b) summing the chip and non-chip membership values to produce membership sums and c) determining whether the possible sawing chip is a sawing chip based on the membership sums.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
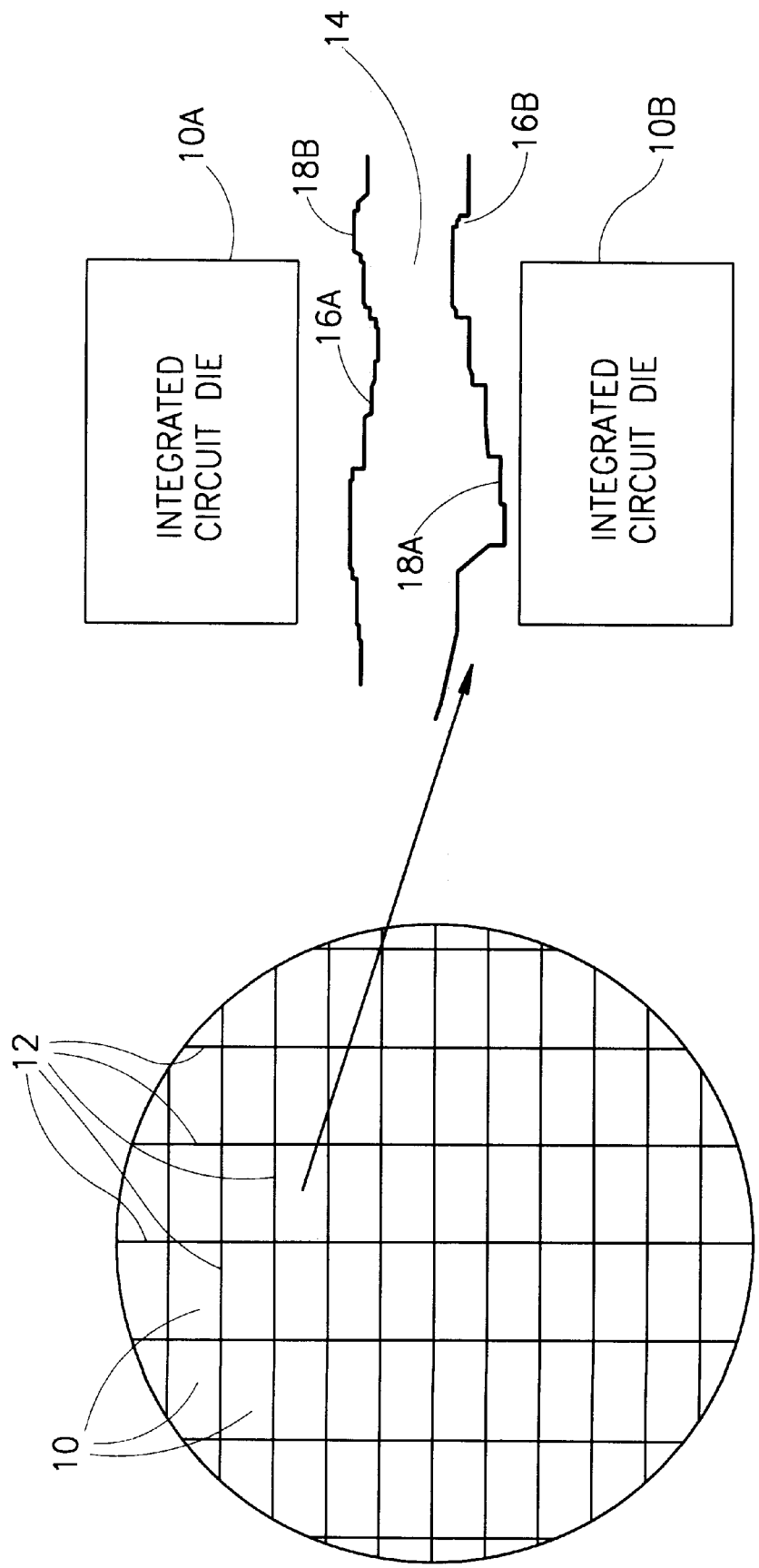
FIG. 1 is a schematic illustration of a semiconductor wafer and the kerfs which occur during dicing of such a wafer.
Figure 2:
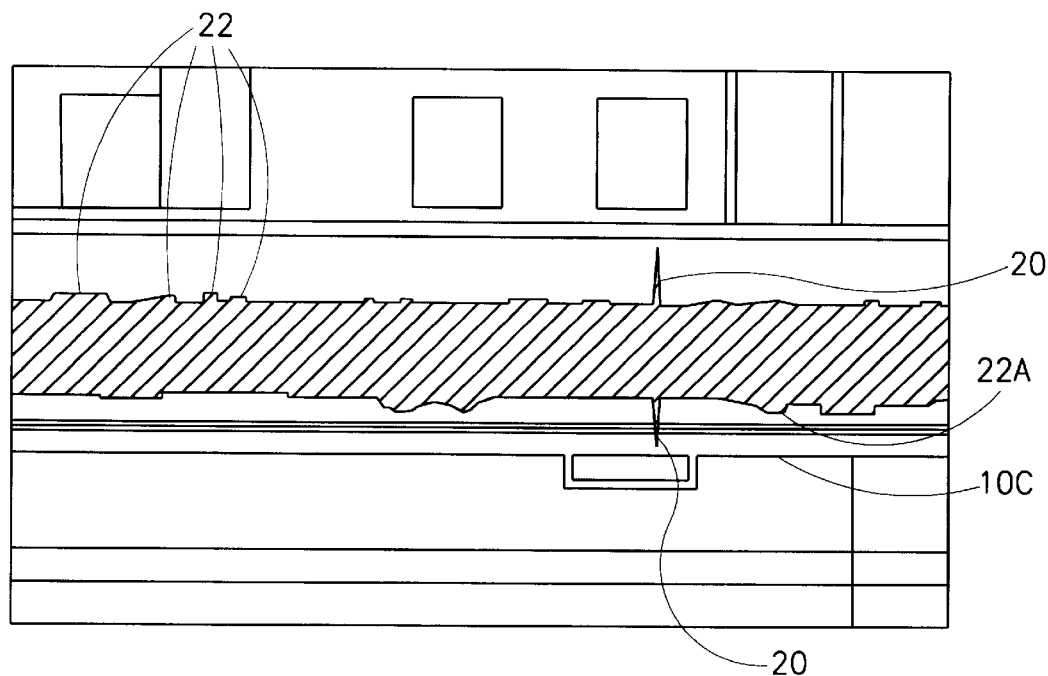
FIG. 2 is a schematic illustration of a kerf and semiconductor wafer after dicing.
Figure 3:
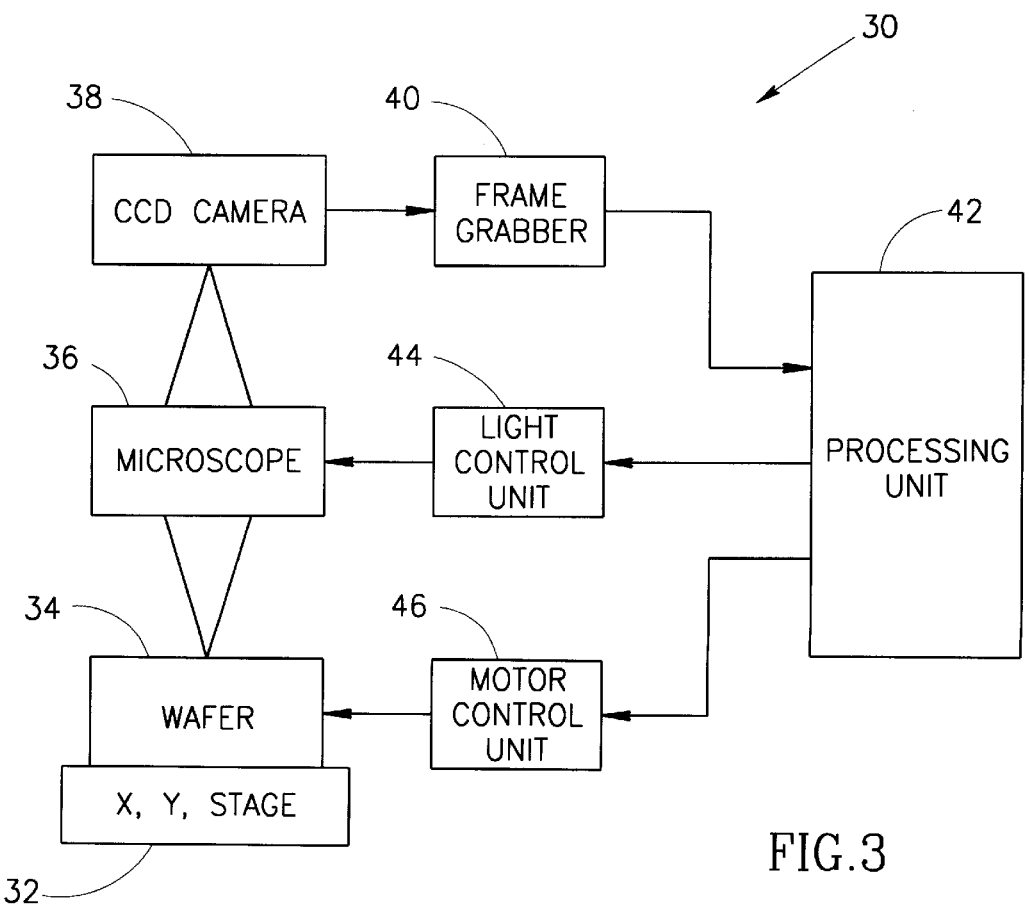
FIG. 3 is a block diagram illustration of a cut analysis system, constructed and operative in accordance with a preferred embodiment of the present invention.
Figure 4A:
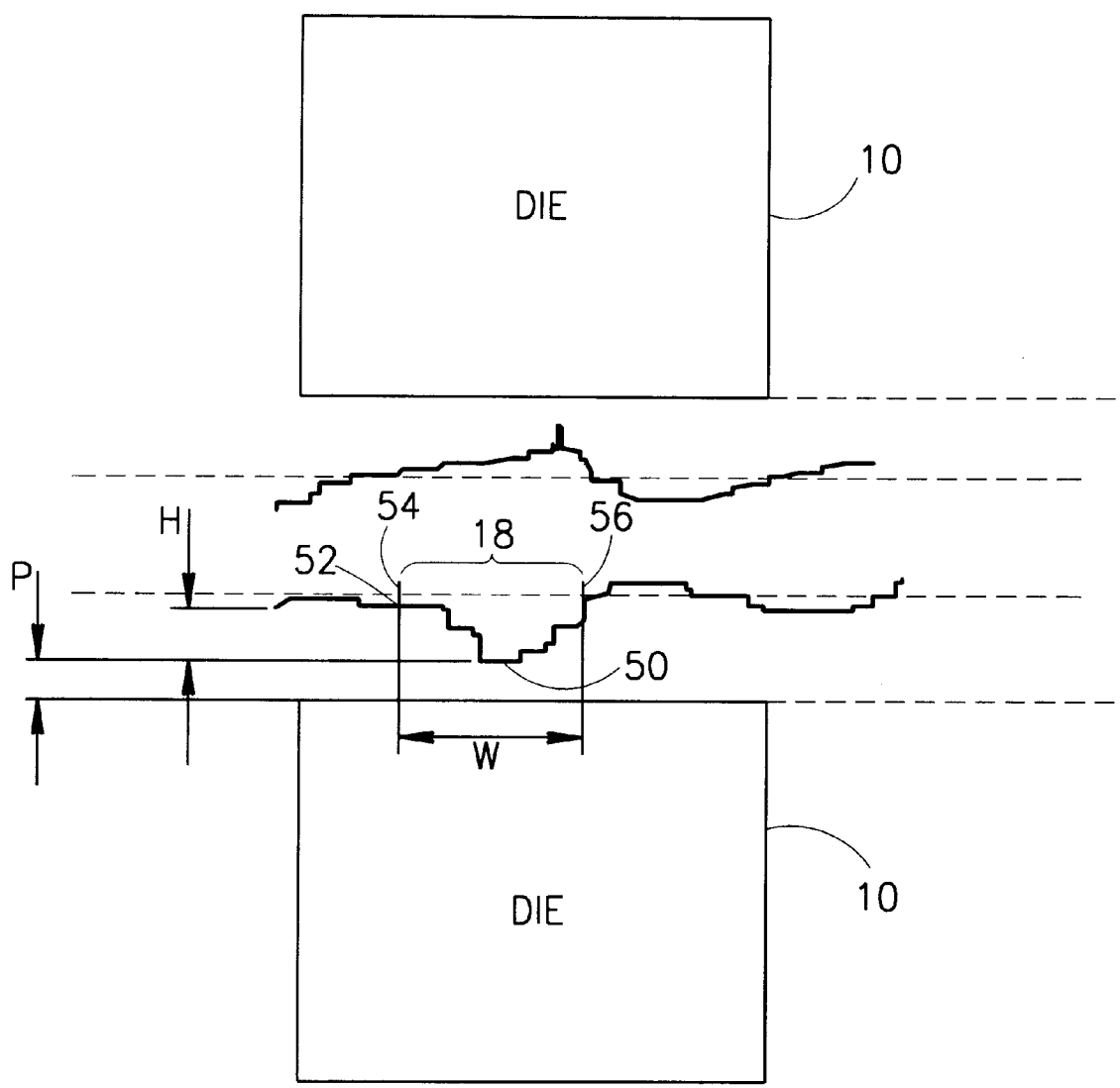
FIGS. 4A, 4B and 4C illustrate cut parameters measured by the system of FIG. 3.
Figure 4B:
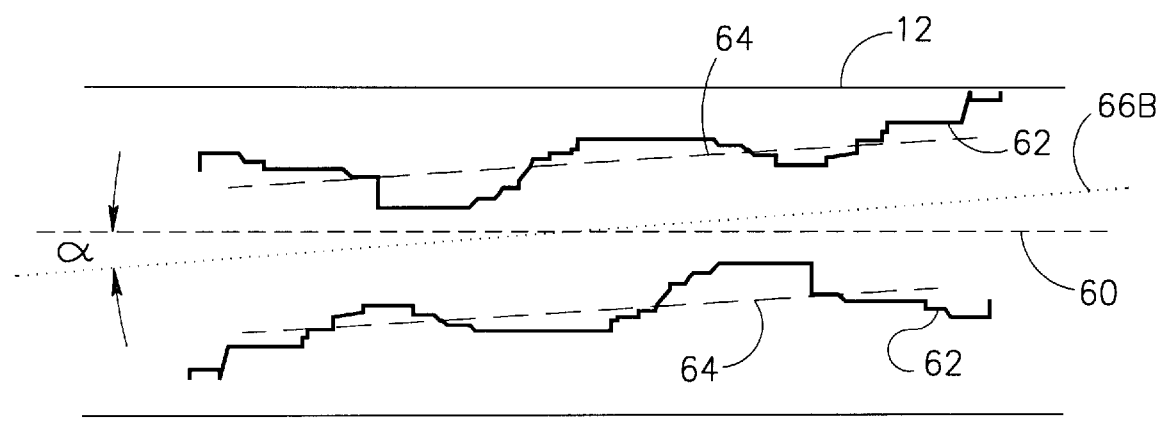
Figure 4C:
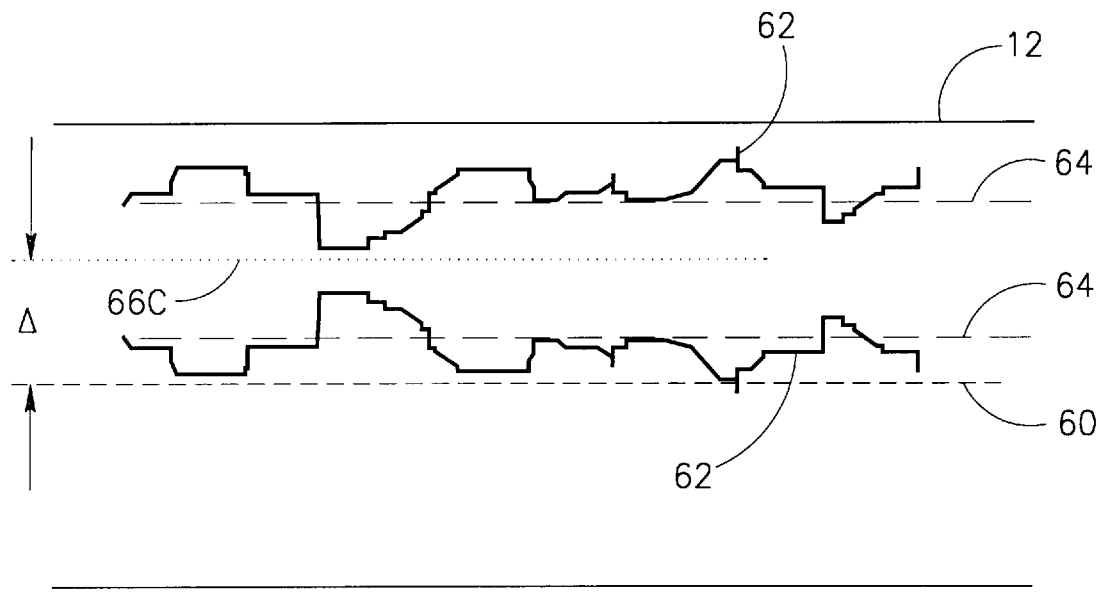

Reference is now made to FIG. 3 which illustrates, in block diagram form, the elements of a cut analysis system 30, constructed and operative in accordance with a preferred embodiment of the present invention, and to FIGS. 4A, 4B and 4C which illustrate the various parameters measured by the system 30.

Cut analysis system 30 comprises a two-dimensional X/Y stage 32 upon which a wafer 34 is to be placed, a microscope 36 and a charge coupled device (CCD) camera 38 which view the wafer 34, a frame grabber 40 which provides each frame of image data from the CCD camera 38 to a processing unit 42 (detailed hereinbelow), a light control unit 44 which controls the lighting of microscope 36 under instructions from processing unit 42 and a motor control unit which controls the X/Y stage 32 under instructions from processing unit 42. It is noted that microscope 36 and CCD camera 38 are translatable in the Z axis, thereby to effect focusing.

Thus, upon receipt of a wafer 34 (typically from an automatic manipulator), system 30 aligns itself to the wafer 34 and scans the front face of the wafer along the streets 12, thereby to view kerfs. Processing unit 42 determines which portions of the viewed kerfs are sawing chips and which are either lithographic shapes or other types of non-chip artifacts and stores the information for later analysis.

As illustrated in FIGS. 4A, 4B and 4C, there are a set of parameters which define the quality of the cut that the saw blade provides and from which processing unit 42 determines if the saw blade is functioning properly. The first three parameters refer to the sawing chips and are: the height H, the width W and the penetration P of each sawing chip 18. The height H and width W refer to the sawing chip itself and the penetration P describes the relationship of the sawing chip to its corresponding die 10. The height H is defined as the distance from the average lowest point 50 in the sawing chip to the average highest point 52 therein while the width W is defined as the distance from the start 54 to the finish 56 of the sawing chip. The penetration P is the distance of the average lowest point 50 to the closest die 10. If the penetration P is too small, the die corresponding to it is disqualified. It is noted that the values of H, W and P are determined for each sawing chip found.

FIGS. 4B and 4C illustrate the kerf related parameters defining the alignment of the saw with respect to the street center line 60. FIG. 4B illustrates two kerfs non-parallel to the street center line and FIG. 4C illustrates kerfs offset from the street center line. FIGS. 4B and 4C show two kerfs 62, their approximate center lines 64 and cut center lines 66B (FIG. 4B) and 66C (FIG. 4C) parallel to both kerf center lines 64. FIG. 4B shows a cut center line 66B which is non-parallel to the street center line 60 and thus, there is an angle α therebetween. FIG. 4C shows a cut center line 66C which is parallel to street center line 60 but significantly offset therefrom, by an amount Δ. The values of α and Δ are determined for each street 12. If they are outside of an allowable range (which can be predetermined or adaptably determined), then the saw blade is misaligned.

Figure 5:
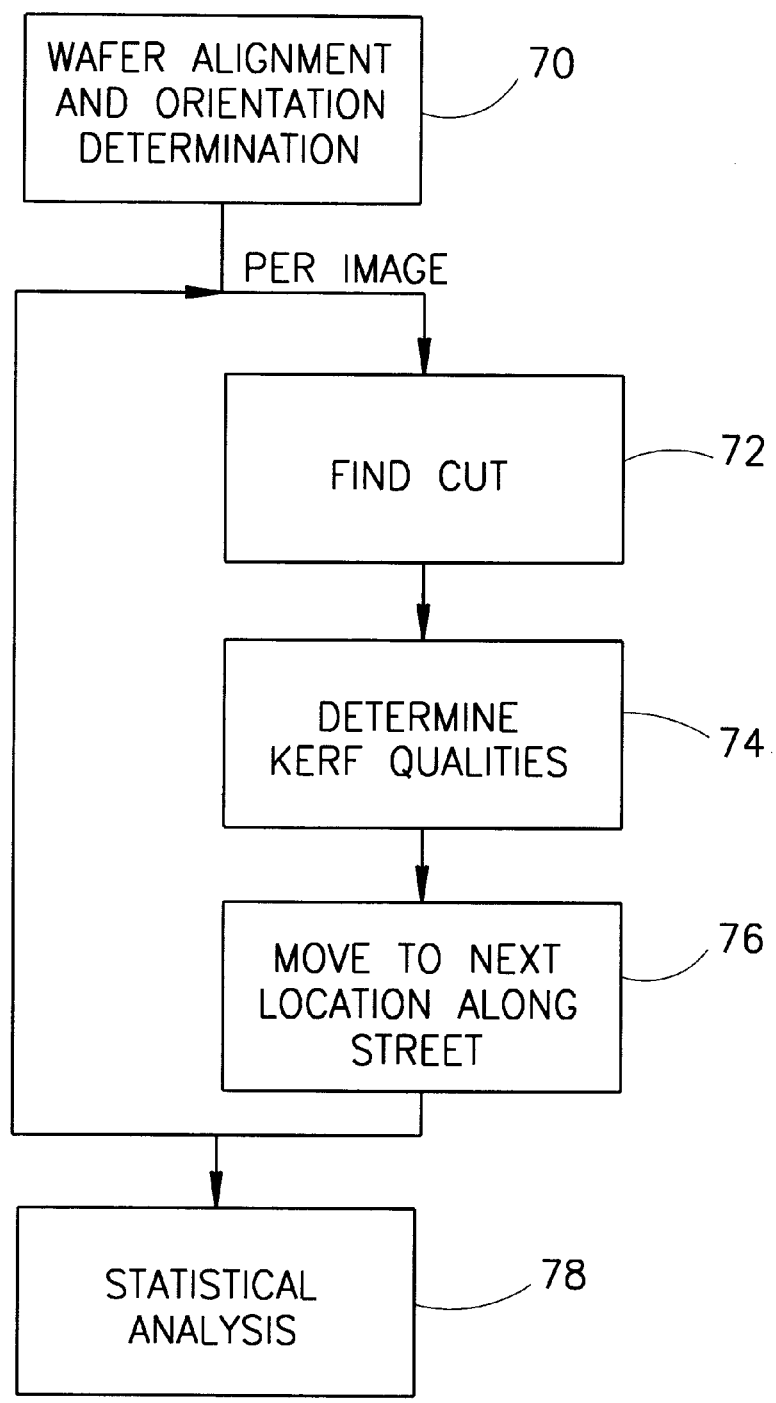
FIG. 5 is a flow chart illustration of the operations of the system of FIG. 3.

Reference is now made to FIGS. 5, 6, 7A, 7B, 7C, 8, 9, 10A, 10B, 10C, 11A, 11B, 11C, 12A and 12B which illustrate the operations of the processing unit 42. Initially (step 70 of FIG. 5), processing unit 42 determines the wafer alignment and orientation thereby to determine the locations of the streets 12. Processing unit 42 then causes the wafer to move such that the microscope 36 and CCD camera 38 view a street 12. Per image produced by CCD 38, processing unit 42 finds the cut (step 72) and determines the qualities of the kerfs of the cut (step 74). Following that, processing unit 42 moves the X/Y stage 32 to the next location along the street (step 76). After scanning all of the streets 12, processing unit 42 reviews the stored data and performs the statistical analysis (step 78) discussed hereinabove, in particular to determine which dies are not good and whether or not the saw blade is properly aligned.

Figure 6:
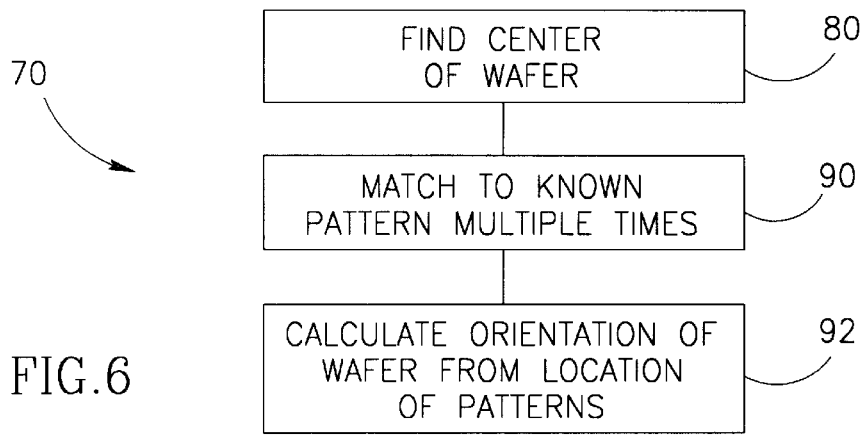
FIG. 6 is a flow chart illustration of a wafer alignment operation forming part of the method of FIG. 5.
Figure 7A:
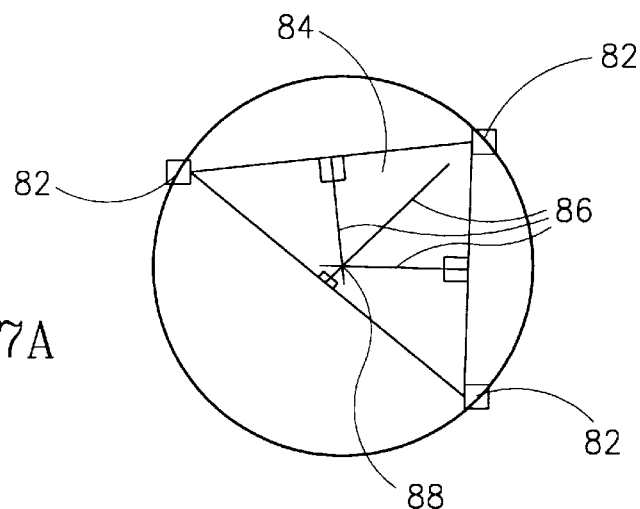
FIGS. 7A, 7B and 7C are schematic illustrations useful in understanding the operations of the method of FIG. 6.
Figure 7B:
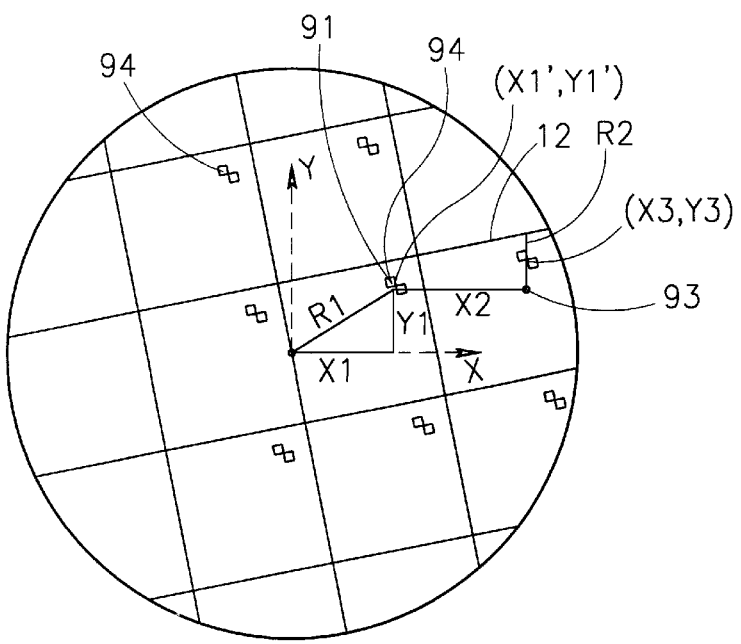

FIG. 6 illustrates the operations involved in determining the alignment and orientation of the wafer (step 70). FIGS. 7A and 7B are useful in understanding the operations of FIG. 6. The processing unit 42 first finds the center of the wafer (step 80). As shown in FIG. 7A, this involves identifying the perimeter of the wafer (an edge detection operation) and then selecting three relatively separate points 82 which sit on the perimeter. As shown in FIG. 7A, the three points define a triangle 84 whose sides are three chords of the wafer. The three perpendicular bisectors 86 of the sides of the triangle intersect at the center point 88 of the wafer.

Returning to FIG. 6, the processing unit 42 then determines the orientation of the wafer (steps 90 and 92). For example, FIG. 7B illustrates a wafer which is slightly rotated from the X-Y coordinate system (in dotted lines) of the CCD 38.

In step 90, processing unit 42 causes CCD 38 to view a location 91 at a known distance R1 (FIG. 7B) from the wafer center 88. Typically, moving to location 91 requires movement in the X and Y directions of the CCD 38 of size (X1,Y1).

At location 91, unit 42 two-dimensionally correlates the received image with a known pattern (for example, pattern 94) expected to be on each die. The exact location (X1',Y1') of pattern 94 is stored and the CCD 38 then caused to move the width X2 of one die along the X direction only. If the wafer is oriented along the X and Y directions of the CCD 38, another pattern 94 will be located at point 93 where the CCD 38 now views. Unit 42 performs a second correlation with the received image and the known pattern to determine the exact location (X3,Y3) of the second pattern 94. The difference between the expected location (X1'+X2,Y1') and the exact location (X3,Y3) of the second pattern 94 determines the orientation of the wafer with respect to the coordinate system of the cut analysis system. The latter is determined in step 92. Once the orientation is known, the locations of the streets 12 are also known. Therefore, the system then moves the distance R2 along the now known Y direction of the wafer to the nearest street 12.

Figure 7C:
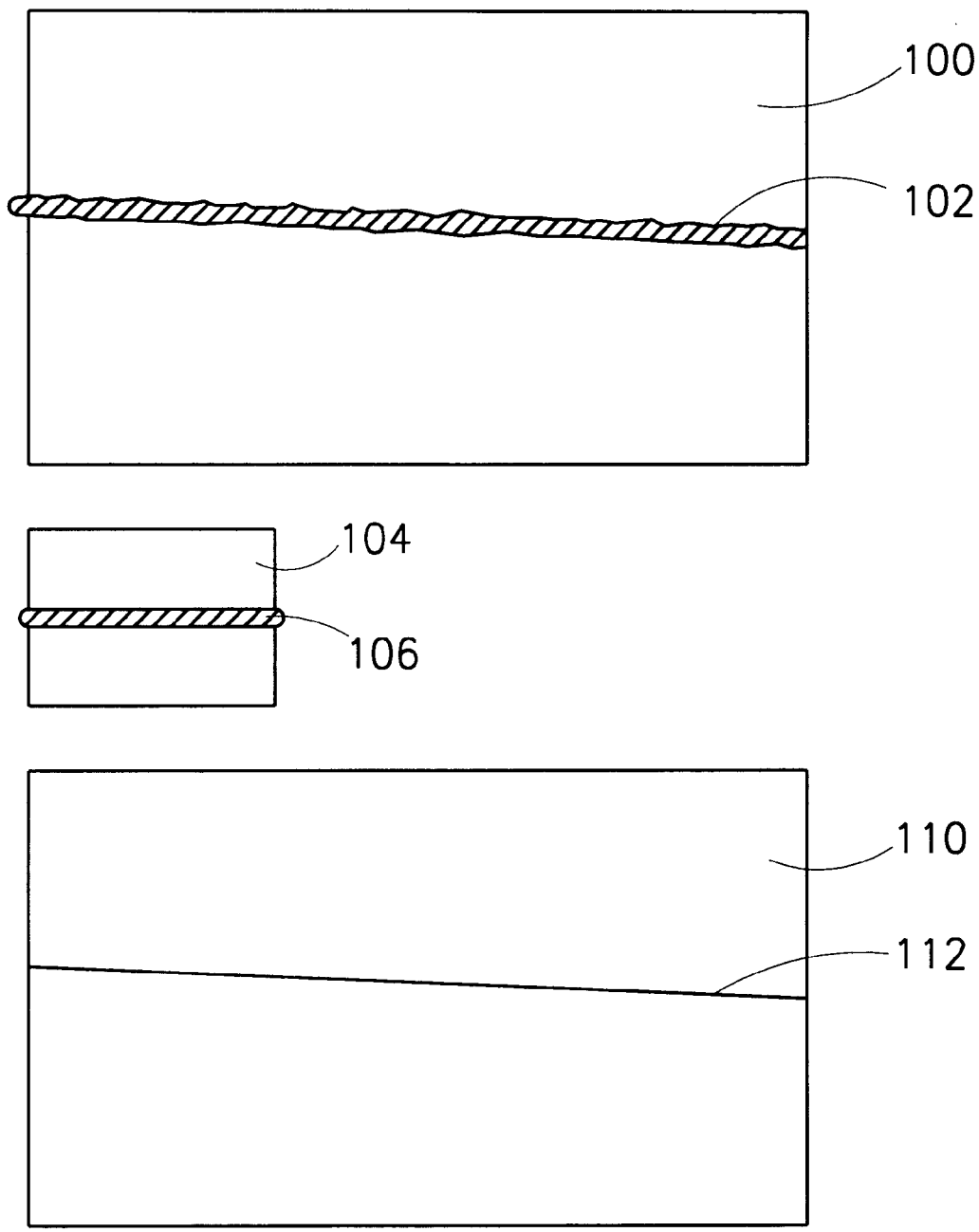

As mentioned hereinabove, the system then begins scanning the streets and, for each image, finds the cut. FIG. 7C indicates how the cut is found. An image 100 has a dark section 102 thereon where the cut is. The processing unit 42 convolves image 100 with a template 104 having a dark line 106 of the expected thickness of the cut thereon. Typically, template 104 is considerably smaller than image 100. The output, shown at 110, is an image having a line 112 along the center of the cut area. The line 112 represents the middle of the cut in image 100 and the coordinates and slope of line 112 are stored.

Figure 8:
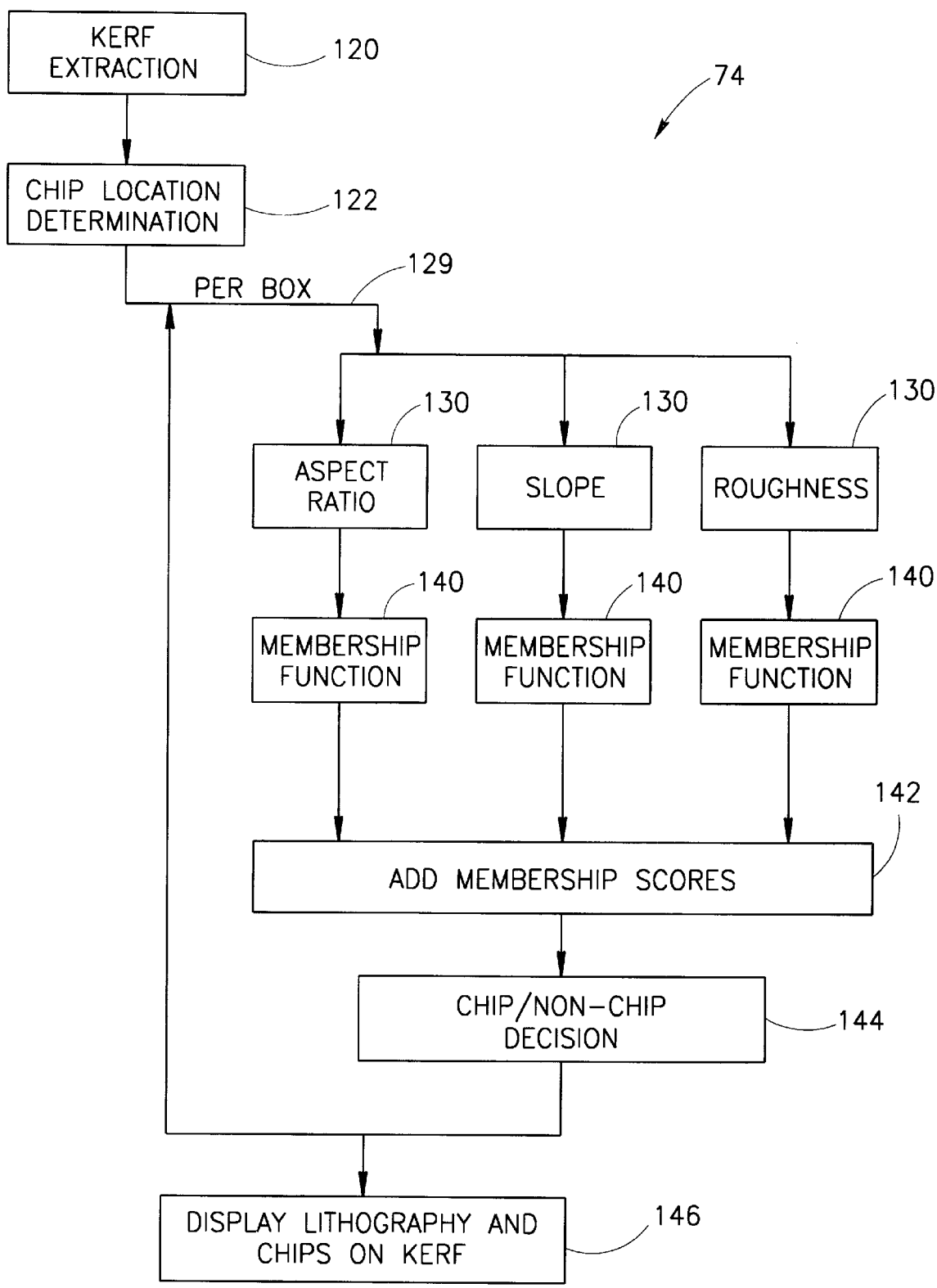
FIG. 8 is a flow chart operation of a kerf parameter identification operation forming part of the method of FIG. 5.

FIG. 8 illustrates the steps to determine the kerfs and their qualities and FIGS. 9, 10A, 10B, 10C, 11A, 11B and 11C are useful in understanding the operations shown in FIG. 8. Initially (step 120), the edges of the cut (i.e. the kerfs) are extracted. This involves moving perpendicularly away from the center line 112 until the intensity of the image's pixels changes to the intensity associated with the "non-cut" area. The non-cut intensity can be set a priori or it can be measured for each image prior to extracting the kerfs. The point at which the intensity changes is a kerf point and the location of the kerf point is recorded. The points above the center line 112 define one kerf and the points below the center line 112 define a second kerf.

Figure 9:
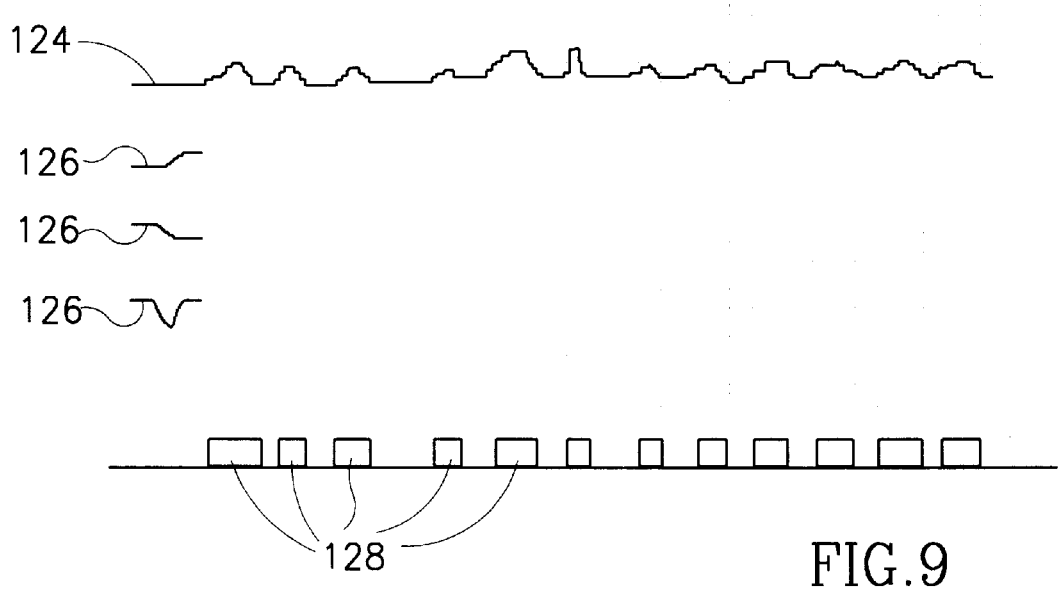
FIG. 9 is a schematic illustration of a convolution operation forming part of the method of FIG. 8.

Each kerf contains sawing chip sections, lithographic sections and plain kerf sections. In step 122, the possible chip sections are determined by convolving the kerf line with three kernels, each of which represents a common shape of a sawing chip. The convolution operation is shown in FIG. 9 where curve 124 is the kerf itself and the three kernels are labeled 126. The output is a sequence of boxes 128 of different shapes which include one portion of kerf 124 which has a shape similar to one of the three kernels 126.

In loop 129, the processing unit 42 separately processes each box 128 and the kerf shape stored therein. Each box is provided to each of three steps 130 which extract certain parameters of the boxes 128 and the kerf shape stored therein. These parameters are: aspect ratio, slope and roughness.

Figure 10A:
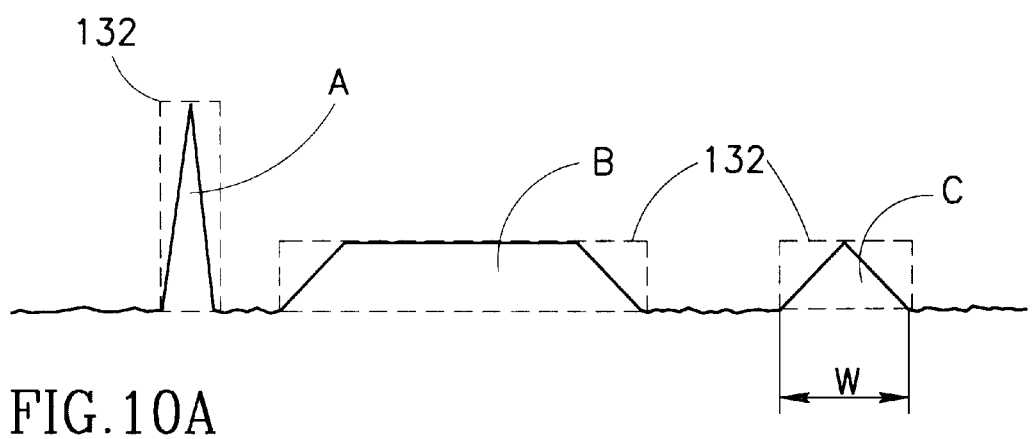
FIGS. 10A, 10B and 10C are schematic illustrations of sawing chip parameters.
Figure 11A:
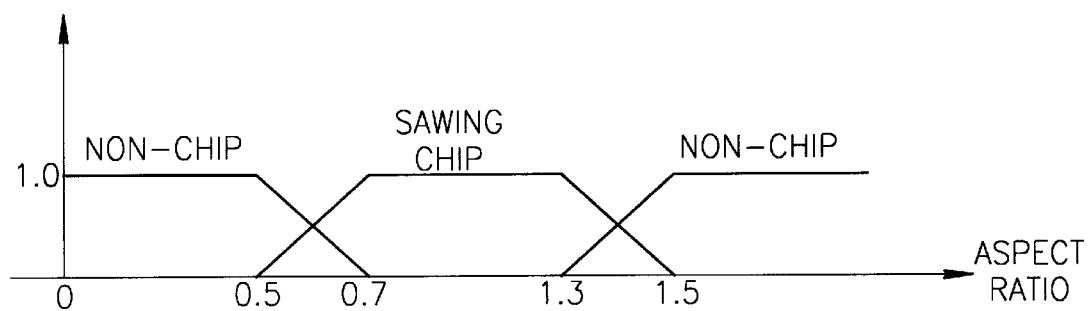
FIGS. 11A, 11B and 11C are graphical illustrations of membership functions for the sawing chip parameters of FIGS. 10A, 10B, and 10C, respectively.

The aspect ratio is the width of the box divided by its height. FIG. 10A shows three different possible chips, labeled A, B and C. Possible defect A is thin and narrow and has the shape typical of a lithographic line. Possible defect B is long and thin and is also unlikely to be a sawing chip while possible defect C has the standard chip shape. FIG. 11A illustrates the "membership function" for the aspect ratio parameter. For aspect ratios between 0.5 and 1.5, the possible defect is likely to be a sawing chip. For aspect ratios below 0.7 and above 1.3, the possible defect is probably lithography or any non-chip artifact. Unfortunately, there is an overlap zone, for aspect ratios between 0.5 and 0.7, and between 1.3 and 1.5 in which it is not possible to differentiate the type of defect.

Figure 10B:
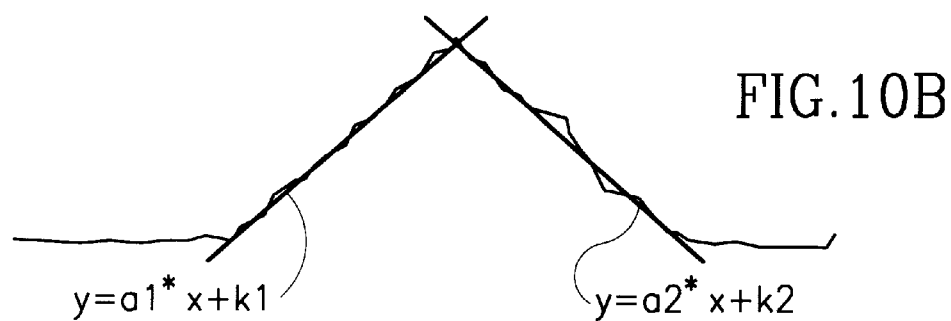
Figure 11B:
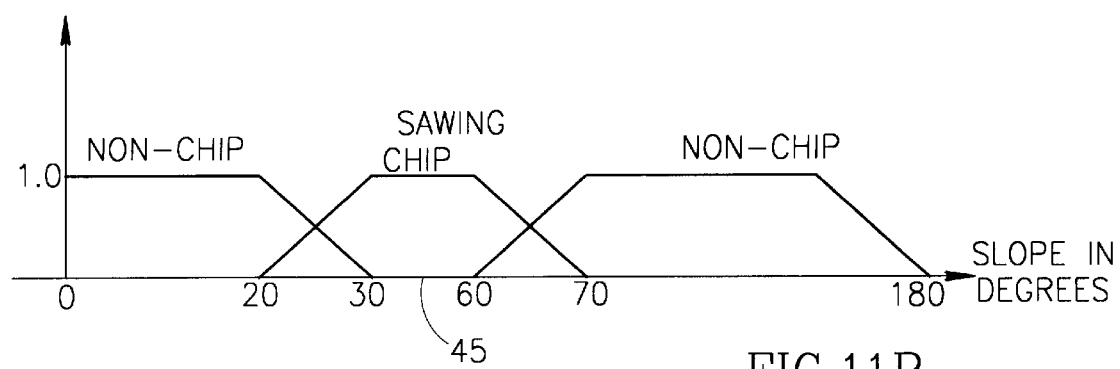

FIG. 10B illustrates the second parameter which is the slopes a1 and a2 of the two halves of the kerf edge. Processing unit 42 determines the slopes a1 and a2 by determining the equations of the lines which best fit the two halves. FIG. 11B provides the membership function for the slope parameter which indicates that slopes providing an angle to the horizontal of close to 45° are sawing chips. Slopes having angles between 20° and 70° are accepted as chips while slopes having angles below 30° and above 60° are defined as non-chips. Once again there is an overlap zone, for angles between 20° and 30°, and between 60° and 70° for which it is not possible to differentiate.

Figure 10C:
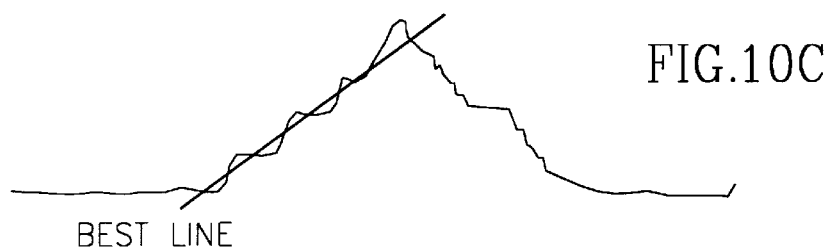
Figure 11C:
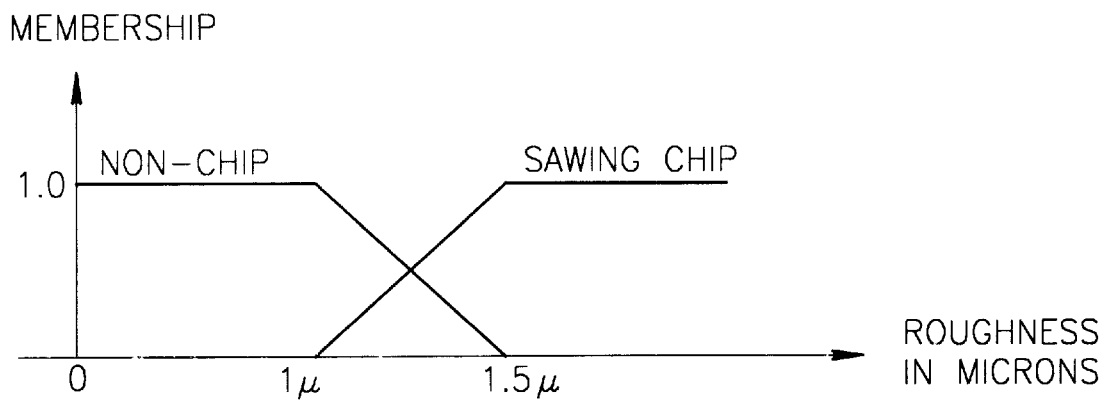

FIG. 10C illustrates the third parameter, that of chipping roughness. Processing unit 42 determines the quality (e.g. standard deviation) of the line approximations used for determining the slopes. Typically, lithographic elements use straight lines so the quality of the approximation will be high. A sawing chip, on the other hand, will be rough and thus, the line approximation will not be very accurate. FIG. 11C provides the membership function in which sawing chips are declared for standard deviations above 1.0 μm and non-chips are declared for standard deviations below 1.5 μm. The overlap area is between 1.0 μm and 1.5 μm.

It is noted that the membership functions for each type (sawing chip or non-chip) provide membership values of 1.0 in the areas of certainty and decrease the values in the overlap areas.

Returning to FIG. 8, the parameters for each box 128 and its kerf edge are determined (steps 130) as are their membership values (steps 140) for being a sawing chip or a non-chip element. In step 142, the membership scores of each possibility are added and, in step 144, the box is marked as being a sawing chip or a non-chip as a function of the membership score.

For example, a possible chip might have chip membership values of 1 for each of the aspect ratio, chip slope and chip roughness parameters and non-chip membership values of 0 for the three parameters. The total chip membership value is 3 and the total non-chip membership value is 0. Thus, the possible chip is declared a chip. In another example, the possible chip might have the following membership values:

| Membership Values | Chip | Non-Chip |
| --- | --- | --- |
| Aspect Ratio | 0 | 1 |
| Chip Slope | 1 | 0 |
| Chip Roughness | 0.7 | 0.3 |
| Total | 1.7 | 1.3 |

The total score is only slightly higher for a sawing chip than for a non-chip and thus, this possible chip is declared a sawing chip also.

If desired, the cut can be displayed (step 146) with the boxes 132 overlaid and some marking (such as by different colors) to indicate the type of element, chipping or non-chip, that was determined.

As mentioned hereinabove, the kerf and sawing chip information are stored for statistical analysis thereof and for determining if any dies are defective. The latter is dependent on the amount of penetration of the sawing chips in the kerfs along its edges. The statistical analysis reviews the kerf and sawing chip information for each street 12, for the entire wafer and for a large collection of wafers to determine if the quality of cutting has changed or if the saw blade is misaligned.

Figure 12A:
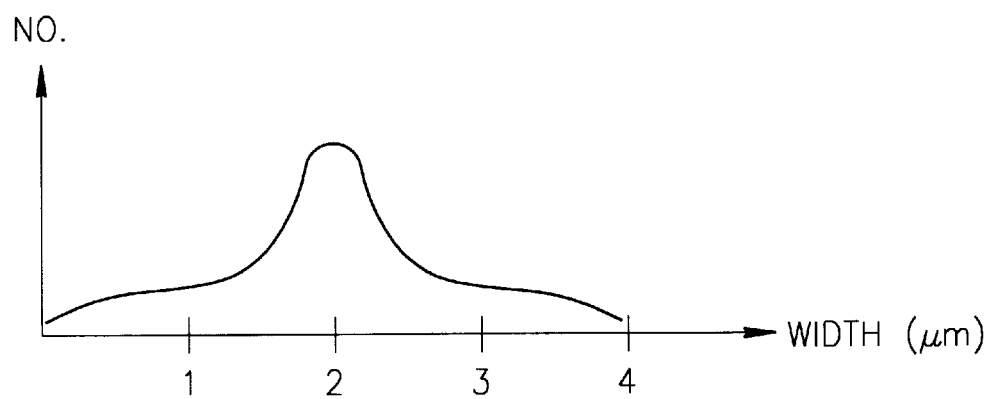
FIGS. 12A and 12B are exemplary histograms useful in understanding the method of FIG. 5.

For example, a histogram of the width and height of the sawing chips (of a street, a wafer, or a batch of wafers) is maintained. FIG. 12A shows an exemplary histogram for width in which the median width is about 2 μm. Should the median width and height become too large (based on a threshold value), the system provides a warning.

The statistical analysis also involves determining the angle α and the offset Δ for each street or for each viewed cut. Histograms of the angle α and the offset Δ are maintained and the saw realigned when their median values become larger than a predetermined value.

Figure 12B:
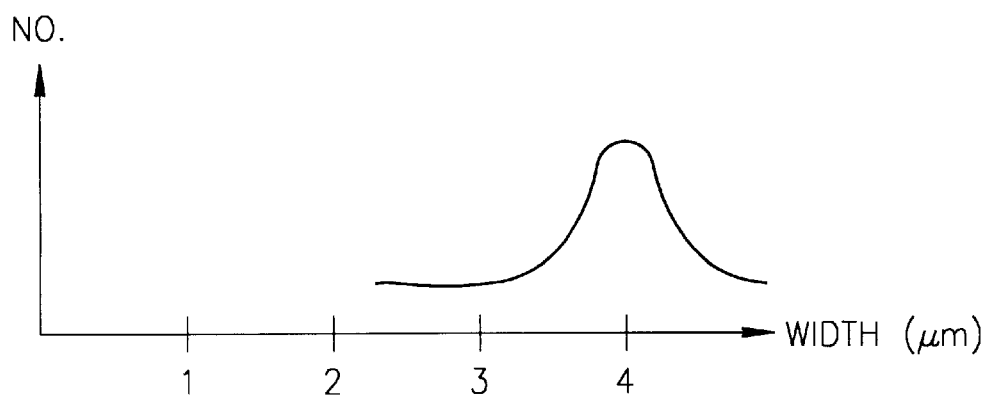

If desired, the symmetry of the dicing can be determined by comparing the histograms of the two kerfs (e.g. upper and lower) of every cut. FIG. 12B shows a second exemplary histogram of width in which the median width is around 4 μm. If FIG. 12A is for the upper kerfs and FIG. 12B is for the lower kerfs, then the saw blade is not symmetric. The user can define a metric of similarity and the range of allowed values.

Other statistics, such as number of dies disqualified due to dicing, number of blades changed per time period, etc., can also be maintained, as desired.

It will be appreciated by persons skilled in the art that the present invention is not limited by what has been particularly shown and described herein above. Rather the scope of the invention is defined by the claims which follow:

What is claimed is:

1. A system for analyzing the quality of the sawing of a material, the system comprising:

scanning means which scans along cuts of said material and which views at least a portion of a cut;

a cut parameter identifier which identifies and stores parameters of said viewed cut portion, said cut parameter identifier comprising:

a kerf identifier which identifies upper and lower kerfs of said viewed cut portion; and a chip parameter identifier which identifies sawing chips along said upper and lower kerfs and determines parameters thereof; and a cut analyzer which analyzes said parameters of a multiplicity of viewed cut portions and which determines the quality of said cuts therefrom.

2. A system according to claim 1 and wherein said chip parameters include at least one of the following parameters: chip height, chip width, chip aspect ratio, chip penetration, chip roughness and chip slope.

3. A system according to claim 2 and wherein said chip parameter identifier includes means for identifying possible sawing chips, means for determining said chip parameters for said possible sawing chips and means for marking said possible sawing chips as sawing chips or as non-chip elements based on the values of said chip parameters.

4. A system according to claim 1 and wherein said cut analyzer comprises a cut parameter identifier which compares a center line of said viewed cut portion, defined by center lines of said upper and lower kerfs, to a center line of a street within which said cut occurred to produce at least one of the following cut parameters: cut angle and cut offset.

5. A method of identifying sawing chips, the method comprising the steps of:

identifying upper and lower kerfs of a viewed cut section;

identifying possible sawing chips along said upper and lower kerfs;

determining chip parameters for each of said possible sawing chips; and marking said possible sawing chips as sawing chips or as non-chips based on the values of said chip parameters.

6. A method according to claim 5 and wherein said chip parameters include at least one of the following parameters: chip height, chip width, chip aspect ratio, chip penetration, chip roughness and chip slope.

7. A method according to claim 5 and wherein said step of marking includes the steps of associating a plurality of chip and non-chip membership values with said possible sawing chips based on the values of said chip parameters, summing said chip and non-chip membership values to produce membership sums and determining whether said possible sawing chip is a sawing chip based on said membership sums.

* * * * *